US008903146B2

(12) United States Patent
Wakai

(10) Patent No.: US 8,903,146 B2
(45) Date of Patent: Dec. 2, 2014

(54) IMAGE DIAGNOSIS APPARATUS

(75) Inventor: Satoshi Wakai, Nasushiobara-Shi (JP)

(73) Assignees: Kabushiki Kaisha Toshiba, Tokyo (JP); Toshiba Medical Systems Corporation, Tochigi-Ken (JP)

( * ) Notice: Subject to any disclaimer, the term of this patent is extended or adjusted under 35 U.S.C. 154(b) by 94 days.

(21) Appl. No.: 13/429,854

(22) Filed: Mar. 26, 2012

(65) Prior Publication Data

US 2012/0195482 A1 Aug. 2, 2012

Related U.S. Application Data

(63) Continuation of application No. PCT/JP2011/076079, filed on Nov. 11, 2011.

(30) Foreign Application Priority Data

Nov. 12, 2010 (JP) .................................. 2010-254148

(51) Int. Cl.
*G06K 9/68* (2006.01)
*G01R 33/56* (2006.01)
*G01R 33/563* (2006.01)

(52) U.S. Cl.
CPC ...... *G01R 33/5608* (2013.01); *G01R 33/56341* (2013.01)
USPC ........... 382/128; 382/130; 382/131; 382/132; 382/190; 382/203

(58) Field of Classification Search
CPC ...... G06K 9/64; G06T 7/0012; G06T 7/0014; G06T 7/0063; G06T 7/0067; G06T 7/0051
USPC ......... 382/100, 103, 128, 130, 131, 132, 134, 382/181, 190, 195, 203; 128/99; 250/455; 600/18
See application file for complete search history.

(56) References Cited

U.S. PATENT DOCUMENTS

| 7,187,800 | B2 * | 3/2007 | Hibbard .................. 382/173 |
| 2010/0220917 | A1 * | 9/2010 | Steinberg et al. ........... 382/134 |
| 2011/0235878 | A1 * | 9/2011 | Nakayama ................ 382/128 |

FOREIGN PATENT DOCUMENTS

| JP | 2000-342558 | 12/2000 |
| JP | 2005-131011 | 5/2005 |
| JP | 2006-136506 | 6/2006 |
| JP | 2009-148314 | 7/2009 |
| WO | WO 2007/052634 | 5/2007 |
| WO | WO 2010/032472 | 3/2010 |
| WO | 2010/055815 A1 | 5/2010 |

OTHER PUBLICATIONS

English Translation of International Preliminary Report on Patentability issued May 28, 2013 for Application No. PCT/JP2011/076079.

(Continued)

*Primary Examiner* — Ali Bayat
(74) *Attorney, Agent, or Firm* — Nixon & Vanderhye PC

(57) ABSTRACT

According to one embodiment, an image diagnosis apparatus includes a line shape information generating unit and a comparing unit. The line shape information generating unit is configured to generate first line shape information corresponding to a first medical image and second line shape information corresponding to a second medical image, respectively. The comparing unit is configured to compare the generated first line shape information with the second line shape information.

22 Claims, 15 Drawing Sheets

(56) References Cited

OTHER PUBLICATIONS

S. Mori et al., "Principles of Diffusion Tensor Imaging and Its Applications to Basic Neuroscience Research", Neuron 51, Sep. 7, 2006, pp. 527-539.

J. Zhang et al., "Fiber Tractography in Diffusion Tensor Magnetic Resonance Imaging: A Survey and Beyond", Laboratory for High Performance Scientific Computing and Computer Simulation, Department of Computer Science, Apr. 11, 2005, pp. 1-26.

M.F. Falangola et al., "Quantitative T2 Analysis in a Transgenic Mouse Model of AD using as Optimized Nonlinear Digital Image Warping Algorithm", Medical Physics, Nathan Kline Institute, Fox Chase Cancer Center, Proc. Intl. Soc. Mag. Reson. Med, 11, 2004, 1 page.

M. Larson et al., "White Matter Abnormalities Detected in Very Early-Onset Disoder", Proc. Intl. Soc. Mag, Reson, Med, 17, 2009, 1 page.

CN Office Action dated Feb. 8, 2014 in CN 2014012900439850.

\* cited by examiner

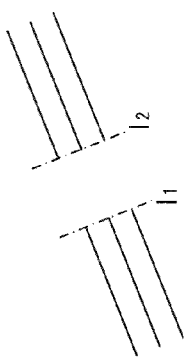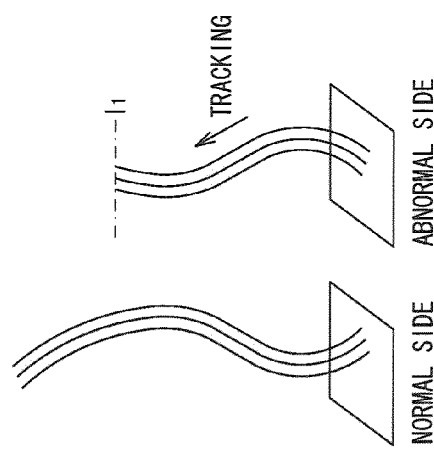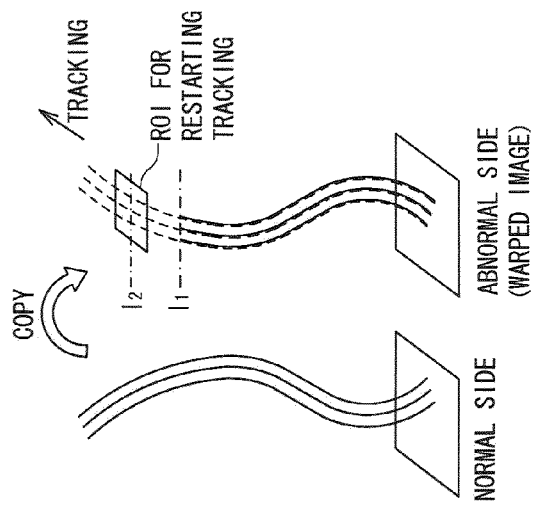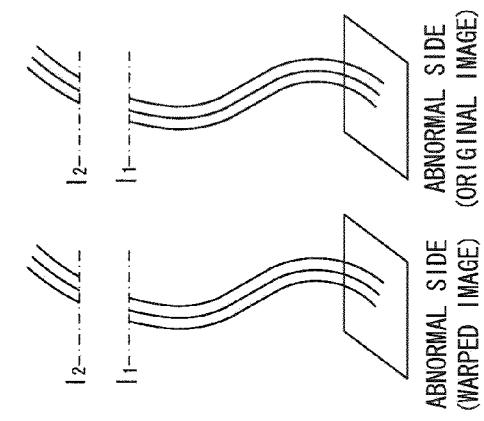

IMAGE DIAGNOSIS APPARATUS

This application is based upon and claims the benefit of priority from Japanese Patent Application No. 2010-254148, filed on Nov. 12, 2010;

The entire contents of which are incorporated herein by reference.

BACKGROUND OF THE INVENTION

1. Field of the Invention

An embodiment of the present invention relates to an image diagnosis apparatus.

2. Description of the Related Art

An MRI (Magnetic Resonance Imaging) apparatus is one of image diagnosis apparatuses used in a medical field, and a related imaging method is diffusion imaging. The diffusion imaging is a method for taking a diffusion weighted image (DWI) which emphasizes a diffusion effect such that particles such as water molecules diffuse owing to thermodynamic Brownian motion. The diffusion imaging draws attention as being useful for early diagnosis of cerebral infarction.

Further, the diffusion imaging develops as diffusion tensor imaging (DTI) in a cerebral nerve area in which anisotropy of nerve fibers is detected or nerve fibers are depicted with the use of anisotropy. While diffusion imaging produces a two-dimensional monochrome image as usual, DTI produces a two-dimensional color image.

Further, an imaging method called "diffusion tensor tractography (DTT)" draws attention as well in recent years. According to DTT, a maximum diffusion direction is tracked, e.g., on a voxel basis or on a slightly expanded voxel basis on the basis of a diffusion tensor image (called a DTI image hereafter) obtained owing to DTI, a trajectory of the tracking is depicted three-dimensionally, and a diffusion tensor tractography image (called a DTT image hereafter) is generated.

Incidentally, technologies including volume rendering, DTT described above and vector flow imaging are known as a method for indicating three-dimensionally linear (line shape) information obtained by the aforementioned MRI apparatus and X ray CT apparatus such as a cerebral blood vessel, a bundle of nerve fibers or blood flow velocity.

Further, as to images of three-dimensionally indicated line shape information, such images of a same patient's same part in time of the onset of a disease and of a study after a medical treatment are arranged side by side, so that a user visually observes the images so as to check an effect of the medical treatment.

A related art is disclosed in Japanese Unexamined Patent Publication No. 2009-148314.

As information density of the line shape information is so high that its indication is complicated, though, it is difficult to visually observe in the case of a tiny change. Thus, in conventional technique, an index indicating a degree of the disease (called an abnormality degree, hereafter) cannot be observed in perspective from a difference between the images in time of the onset of the diseased part and the images in normal condition. Further, there used to be no objective index which indicates to what extent the condition has recovered (called a recovery degree, hereafter) between the images in time of the onset of the diseased part and the images in time of a study while or after being treated.

BRIEF DESCRIPTION OF THE DRAWINGS

In the accompanying drawings:

FIGS. 14A-D provide a conceptual diagram of an operation to estimate nerve fibers in a case where the nerve is damaged on a diseased side;

DETAILED DESCRIPTION

An embodiment of the present invention has been made in view of the aforementioned problems, and a purpose of the embodiment is to provide an image diagnosis apparatus which can calculate and indicate an abnormality degree and a recovery degree by using line shape information such as a blood vessel, nerve fibers, information on a blood flow, etc.

An image diagnosis apparatus of an embodiment includes a line shape information generating unit and a comparing unit. The line shape information generating unit generates first line shape information corresponding to a first medical image and second line shape information corresponding to a second medical image, respectively. The comparing unit compares the generated first line shape information with the second line shape information.

An embodiment of the present invention will be explained below with reference to the drawings.

Figure 1:
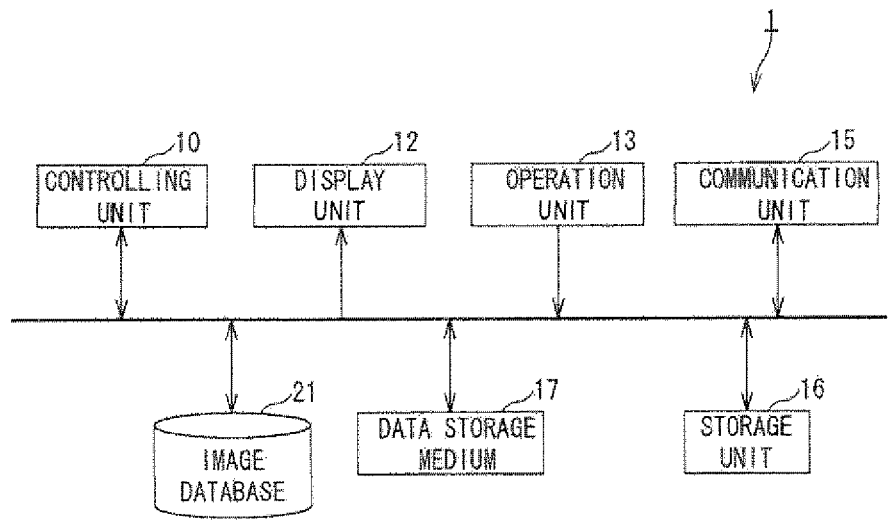
FIG. 1 is a block diagram which schematically illustrates a constitution of an image processing apparatus of an embodiment of the invention.

FIG. 1 is a block diagram which schematically illustrates a constitution of an image processing apparatus 1 (image diagnosis apparatus) of an embodiment of the present invention. The image processing apparatus 1 includes a controlling unit 10, a display unit 12, an operation unit 13, a communication unit 15, a storage unit 16, a data storage medium 17 and an image database 21, and these components are connected with each other through a bus.

The display unit 12 is a monitor, etc. which displays text data, image data, etc. as controlled by the controlling unit 10. The operation unit 13 is an input device such as an operation key, etc. The communication unit 15 is connected to a LAN inside the hospital and performs communication with various kinds of modalities.

The image database 21 stores "a medical image obtained by an image obtaining unit 101 in the controlling unit 10 described later", "a medical image to which three-dimensional line shape information generated by a line shape information generating unit 106 is added", "a diffusion direction vector", etc.

The storage unit 16 provides the controlling unit 10 and the communication unit 15 with a work area. The storage unit 16 can be implemented by a RAM (Random Access Memory), etc.

The data storage medium 17 (computer-readable medium) stores a program, data, etc. The data storage medium 17 can be implemented by a hard disk, a memory (Flash Memory, ROM: Read Only Memory), etc. Programs which make the computer work as each of portions of the embodiment (programs which make the computer run processes of each of the portions), a plurality of application programs, etc. are stored in the data storage medium 17.

The controlling unit 10 is an arithmetic operation device which supervises and controls the image processing apparatus 1 and runs other various arithmetic operation processes, control processes, etc. Functions of the controlling unit 10 can be implemented by hardware components such as various kinds of processors (CPU, DSP, etc.), an ASIC (gate array, etc.) or a program. The controlling unit 10 runs various processes of the embodiment on the basis of the programs (data) stored in the data storage medium 17.

Figure 2:
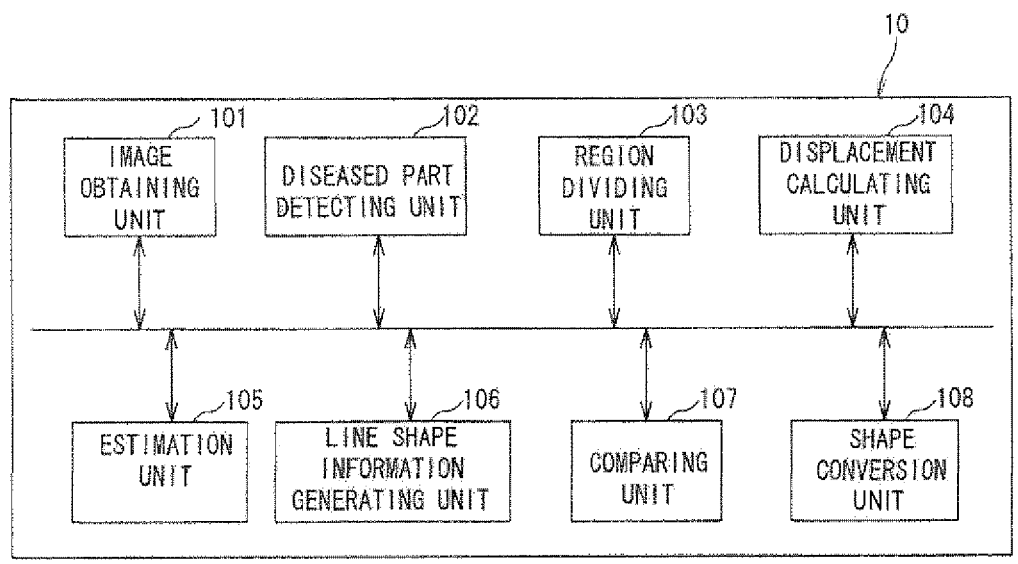
FIG. 2 is a block diagram which schematically illustrates a constitution of a controlling unit of the image processing apparatus.

FIG. 2 is a block diagram which illustrates the controlling unit 10 in detail. The controlling unit 10 includes an image obtaining unit 101, a diseased part detecting unit 102, a region dividing unit 103, a displacement calculating unit 104, an estimation unit 105, a line shape information generating unit 106, a comparing unit 107 and a shape conversion unit 108.

The image obtaining unit 101 obtains an image such as a cerebral image out of DWI images obtained by an external MRI apparatus, via the communication unit 15. Further, the image obtaining unit 101 obtains a DTT image and a diffusion direction vector stored in the image database 21. The diseased part detecting unit 102 detects an abnormal part such as a cerebral infarction part from the medical image of the brain obtained by the image obtaining unit 101, which will be described later in detail. The region dividing unit 103 divides the medical image of the brain obtained by the image obtaining unit 101 into left and right brains along a cerebral mid-spinal line. The displacement calculating unit 104 calculates a "warp field" which indicates displacements of shapes of the left and right brains into which the brain image was divided by the region dividing unit 103. The shape conversion unit 108 converts a shape of an abnormal side or a normal side on the basis of the "warp field" calculated by the displacement calculating unit 104.

The line shape information generating unit 106 carries out a diffusion tensor analysis of a DWI image so as to generate a diffusion tensor image (DTI). Moreover, the line shape information generating unit 106 tracks the maximum diffusion direction on the generated DTI image, and carries out a tractography analysis to three-dimensionally depict a trajectory of the tracking, extracts line shape information of nerve fibers, and thereby generates a diffusion tensor tractography image (called a DTT image, hereafter). Further, the line shape information generating unit 106 calculates a diffusion direction vector which is a vector in a local region of linear fibers from the generated DTT image.

The estimation unit 105 has a function to copy a part of the DTI image on the normal side into the abnormal side and to estimate nerve fibers on the abnormal side. If part of nerve fibers is damaged or significantly deformed in the abnormal side region as being affected by the infarction part, etc., it is so difficult to track the maximum diffusion direction on the DTI image that a DTT image can be hardly generated for nerve fibers located beyond the damaged part or the deformed part in some cases. If that is the case, the estimation unit 105 can replace the damaged part or the deformed part on the abnormal side with a DTI image copied from the normal side so as to make it possible to generate a DTT image for the nerve fibers located beyond the damaged part or the deformed part. The comparing unit 107 compares "nerve fibers in time of the onset of the abnormal part" with "nerve fibers in time of being normal", from the DTT image generated by the line shape information generating unit 106. The comparing unit 107 further compares "nerve fibers in time of the onset of the abnormal part" with "nerve fibers in time of a study while or after being treated".

Then, an operation of the image diagnosis apparatus 1 of the constitution described above will be explained. Suppose, at first, that either one of the left and right brains includes an abnormal part. An operation to cancel a left-to-right shape difference will be explained with reference to FIG. 3.

<Adjustment of Left-to-Right Difference>

The image obtaining unit 101 obtains the entire region of the brain from a medical image taken by the external MRI apparatus and received by the communication unit 15, i.e., T1W (T1 (longitudinal relaxation time)-weighted), T2W (T2 (transverse relaxation time)-weighted) or DWI image, etc (step S101). Then, the abnormal part detecting unit 102 detects an abnormal part such as a cerebral infarction part, etc. from the medical image of the brain obtained by the image obtaining unit 101 by using, e.g., a DWI/PWI (Perfusion Weighted Imaging) mismatch method, etc (step S103).

Then, the region dividing unit 103 divides the medical image of the brain obtained by the image obtaining unit 101 into a left region and a right region along a cerebral mid-spinal line (step S105). At this time, the region on the side including the abnormal part is called an "abnormal side" region, and the region on the side including no abnormal part is called a "normal side" region.

Then, the displacement calculating unit 104 flips the normal side region line-symmetrically with respect to the cerebral mid-spinal line and renders its shape similar to the shape of the abnormal side (step S107). Then, the displacement calculating unit 104 calculates a "warp field" from three-dimensional images of the flipped normal side region and the abnormal side region (step S109). Morphological images, e.g., T1W images or T2W images can be used as the three-dimensional images to be used for calculation of the "warp field". What is the "warp field" mentioned here is as follows. If one of two three-dimensional medical images corresponding to each other is warped, expanded, reduced or rotated with respect to the other, a positional difference between anatomically identical points on the both images is expressed as a vector, and such vectors of respective equivalent points between the two images are gathered into a set expressed as a vector field (warp field). The warp field on the three-dimensional medical image is, e.g., a three-dimensional vector field having resolution on a voxel basis. Once the warp field is calculated, the three-dimensional images of the flipped normal side region and the abnormal side region can be converted so that positions of anatomically identical points can agree with each other. For example, the abnormal side image can be converted by applying the "warp field" to the three-dimensional image in the abnormal side region, so as to make the positions of the anatomically identical points on the abnormal side image and on the flipped normal side image agree with each other. On the other hand, the normal side image can be converted by applying the "warp field" to the three-dimensional image in the flipped normal side region, so as to make the positions of the anatomically identical points on the abnormal side image and on the flipped normal side image agree with each other. Incidentally, the process for calculating the "warp field" may employ a method for either linear position adjustment (rigid registration) or nonlinear position adjustment (non-rigid registration), or a combination of those methods. Further, the displacement calculating unit 104 may use detailed information on anatomical regions such as the central sulcus, the grey matter, etc. so as to calculate a "warp field" for every small region.

Further, the anatomically identical parts may be captured on different positions in images obtained in studies carried out at different times in some cases, even if both images are of the same abnormal side. If that is the case, the warp field between the images taken at different times can be calculated, and the warp field can be applied to either one of the images so as to align the anatomically identical parts with each other.

The "warp field" is useful to correct not only left-to-right asymmetry of a T1W image used for calculation of the warp field, etc. but also left-to-right asymmetry of a DWI image taken in the same study that the T1W image is taken in, and of a DTI or DTT image generated from the DWI image.

Figure 3:
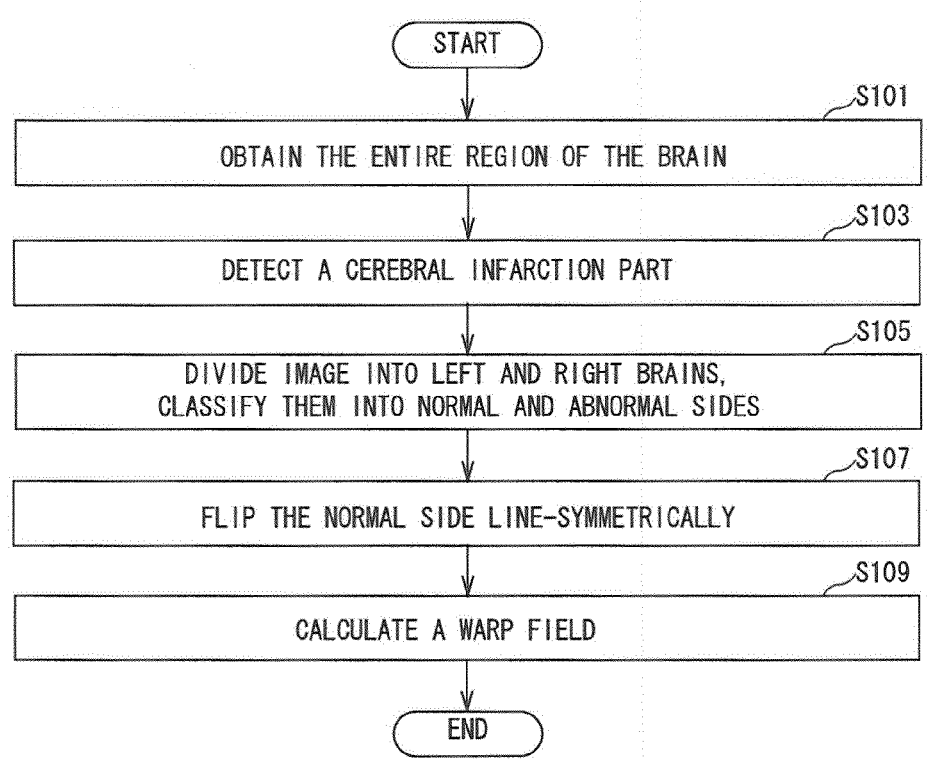
FIG. 3 is a flowchart which illustrates an operation to cancel a shape difference between left and right brains.

According to the present embodiment, the warp field calculated at the step S109 in FIG. 3 is applied to either one of the abnormal and normal sides, and the entire shape difference between nerve fibers on the normal and abnormal sides is absorbed. On top of that, a local displacement of the nerve fibers affected by the cerebral infarction part, etc. on the abnormal side is compared with the nerve fibers on the normal side, so as to calculate an "abnormality degree (disease degree)".

Further, "a 'recovery degree' which relatively indicates to what extent an amount of deformation of nerve fibers on the abnormal side has recovered (or worsened) with respect to the nerve fibers on the normal side" is calculated each time as treatment continues. In order to calculate the recovery degree, the respective DTT images are aligned with each other by using "a warp field for aligning the abnormal side and the normal side with each other" and "a warp field between the images taken at different times".

Incidentally, both or either one of the "abnormality degree" and the "recovery degree" may be calculated.

Figure 4:
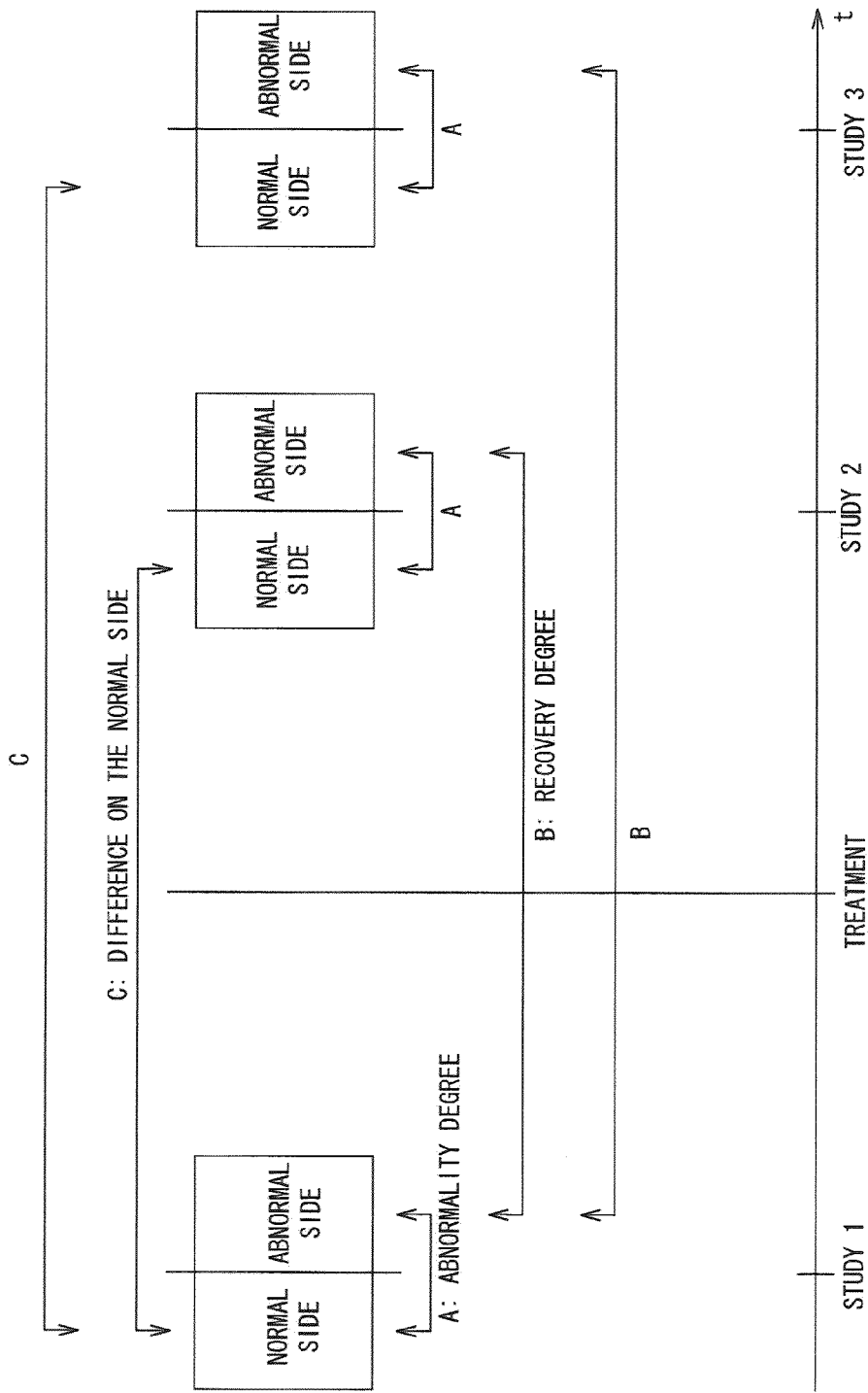
FIG. 4 illustrates changes and relationships of an abnormality degree and a recovery degree in each of studies indicated in chronological order.

FIG. 4 illustrates an idea of the "abnormality degree" and the "recovery degree" in connection with the studies. A study carried out in time of the onset of the disease (before a treatment) is defined as a study 1, and studies carried out after the treatment are defined as a study 2 and a study 3 in chronological order. The "abnormality degree" A is an index which indicates how far a local shape of nerve fibers on the abnormal side has deviated from a shape of nerve fibers on the normal side. Meanwhile, the "recovery degree" B is an index which relatively indicates to what extent the local shape of the nerve fibers on the abnormal side has recovered with respect to the shape of the nerve fibers on the normal side between the study 1 before the treatment and the study 2 after the treatment, or between the study 1 before the treatment and the study 3 after the treatment. Another index, i.e. "difference on the normal side" C indicates a degree of a change on the normal side, if any, between the study 1 before the treatment and the study 2 after the treatment, or between the study 1 before the treatment and the study 3 after the treatment. That is because a difference having been caused on the normal side between the study 1 and the study 2 or between the study 1 and the study 3, if any, needs to be absorbed before the "recovery degree" B is calculated, as the difference is affected by the "recovery degree" B on the abnormal side. How to calculate the "abnormality degree" A and the "recovery degree" B will be explained more specifically below.

<Calculate Abnormality Degree A>

To begin with, an operation to make a DTT image of nerve fibers and to calculate an abnormality degree A by comparing the abnormal side with the normal side will be explained with reference to FIG. 5.

Figure 6:
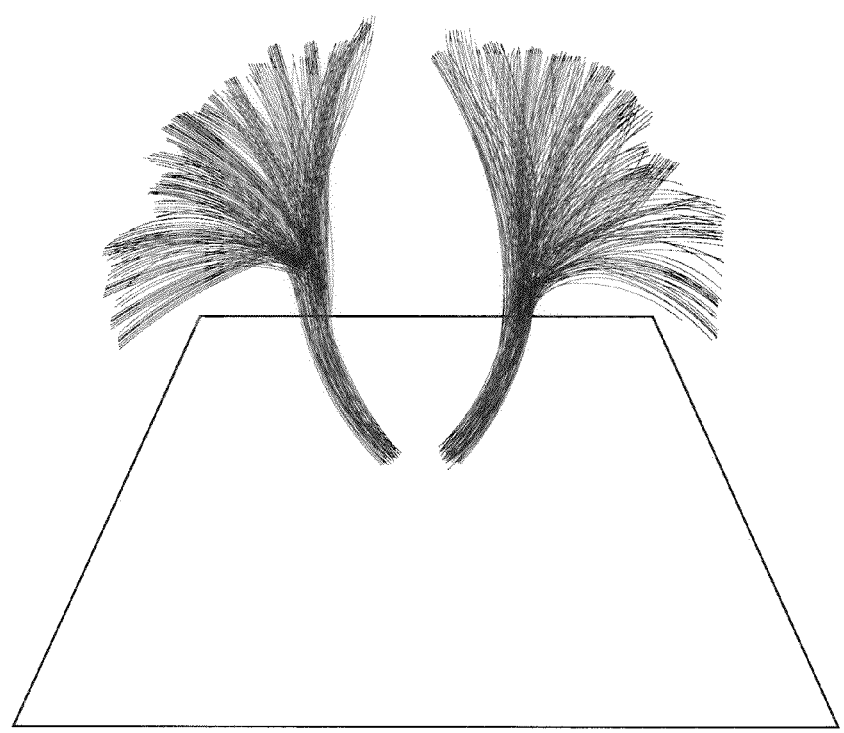
FIG. 6 illustrates an example of a DTT image of cerebral nerve fibers.

The line shape information generating unit 106 tracks a maximum diffusion direction on a DTI image on each of the normal and abnormal sides, carries out a tractography analysis for three-dimensionally depicting a trajectory of the tracking, and extracts line shape information of nerve fibers so as to make a DTT image of the nerve fibers (step S201). FIG. 6 illustrates an exemplary DTT image of nerve fibers of a brain. In FIG. 6, e.g., a two-dimensional DWI image of the brain is combined with a three-dimensional DTT image and displayed. The nerve fibers extended from a particular portion of the brain can be three-dimensionally observed according to the combined image.

Then, the shape conversion unit 108 flips the DTT image on the normal side (step S202). The shape conversion unit 108 further applies the warp field calculated by the displacement calculating unit 104 at the step S109 in FIG. 3 to the flipped DTT image on the normal side so as to align the flipped DTT image on the normal side with the DTT image on the abnormal side (step S203).

Then, the line shape information generating unit 106 calculates a diffusion direction vector on a voxel basis for each of the flipped DTT image on the normal side and the DTT image on the abnormal side which have been aligned with each other at the step S203 (step S205). The diffusion direction vectors calculated from the DTT image on the abnormal side and from the flipped DTT image on the normal side are called the abnormal side vector and the normal side vector, respectively, for convenience below.

Then, the comparing unit 107 calculates an abnormality degree from a difference between a vertex of the normal side vector and a vertex of the abnormal side vector which anatomically correspond to each other. The comparing unit 107 calculates values of the abnormality degree for each of portions of the nerve fibers (step S207).

Then, the controlling unit 10 files the DTT image made at the step S201, the normal side vector and the abnormal side vector calculated on each of positions at the step S205, and the abnormality degree calculated at the step S207 in the image database 21 (step S209).

Figures 7A, 7B, 7C:
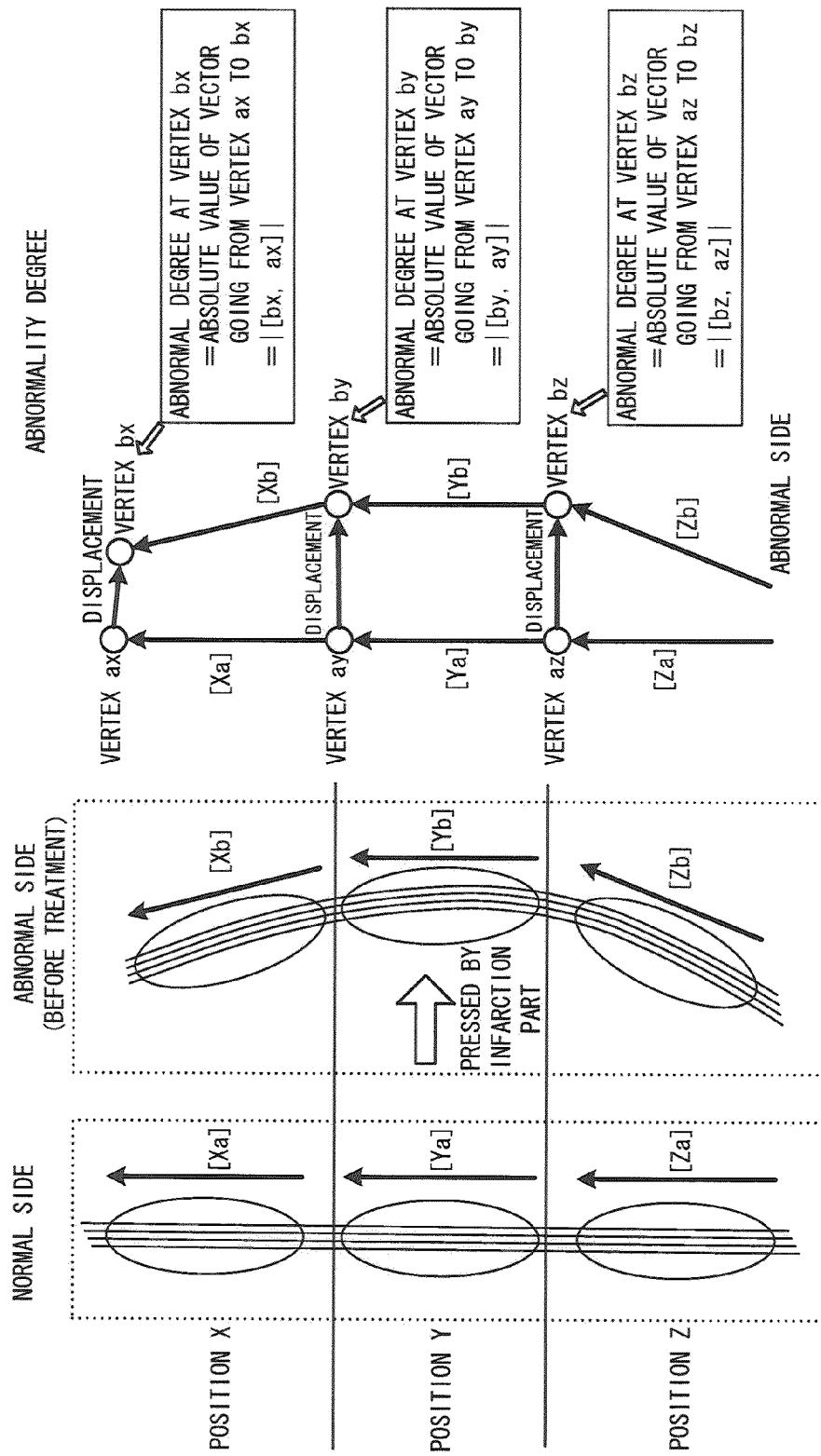
FIGS. 7A-C illustrate how to calculate an abnormality degree.

FIG. 7 (A), FIG. 7 (B) and FIG. 7 (C) illustrate an idea of calculating the abnormality degree described above. FIG. 7 (A) is a conceptual diagram of the nerve fibers at particular positions X, Y and Z on the normal side, and illustrates examples of diffusion direction vectors calculated from the nerve fibers at the respective positions, i.e., normal side vectors [Xa], [Ya] and [Za]. Meanwhile, FIG. 7 (B) is a conceptual diagram of the nerve fibers at positions anatomically corresponding to the positions in FIG. 7 (A) on the abnormal side before a treatment, and illustrates examples of diffusion direction vectors calculated from the nerve fibers at the respective positions, i.e., abnormal side vectors [Xb], [Yb] and [Zb]. The nerve fibers on the abnormal side are locally deformed with respect to the normal side as being pressed by the infarction part, etc. FIG. 7 (C) illustrates an idea of calculating an abnormality degree from the normal side vectors [Xe], [Ya] and [Za] and the abnormal side vectors [Xb], [Yb] and [Zb]. As illustrated in FIG. 7 (C), the abnormality degree is represented by an absolute value of a displacement vector connecting the vertices of the normal side and abnormal side vectors anatomically corresponding to each other. As to the position X, e.g. vertices ax and bx of the normal side and abnormal side vectors [Xa] and [Xb], respectively, anatomically correspond to each other, and an absolute value of a vector [bx, ax] going from the vertex ax to the vertex bx is calculated as an abnormality degree at the position X. Similarly, an abnormality degree at the position Y is calculated as an absolute values of a vector [by, ay] going from the vertex ay to the vertex by, and an abnormality degree at the position Z is calculated as an absolute value of a vector [bz, az] going from the vertex az to the vertex bz, respectively. The abnormality degree may be calculated on a voxel basis from a diffusion direction vector in every voxel, and may be calculated on an over-voxel basis upon a plurality of diffusion direction vectors being linked.

The abnormality degree calculated at each of the positions is filed in the image database 21 together with the DTT image.

<Calculate Recovery Degree B>

Figure 8:
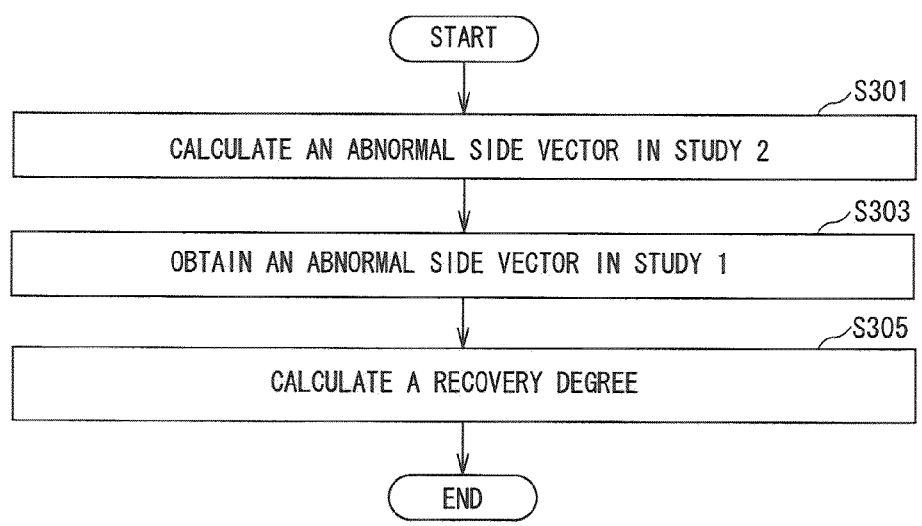
FIG. 8 is a flowchart which illustrates an operation to calculate a recovery degree.
Figure 9:
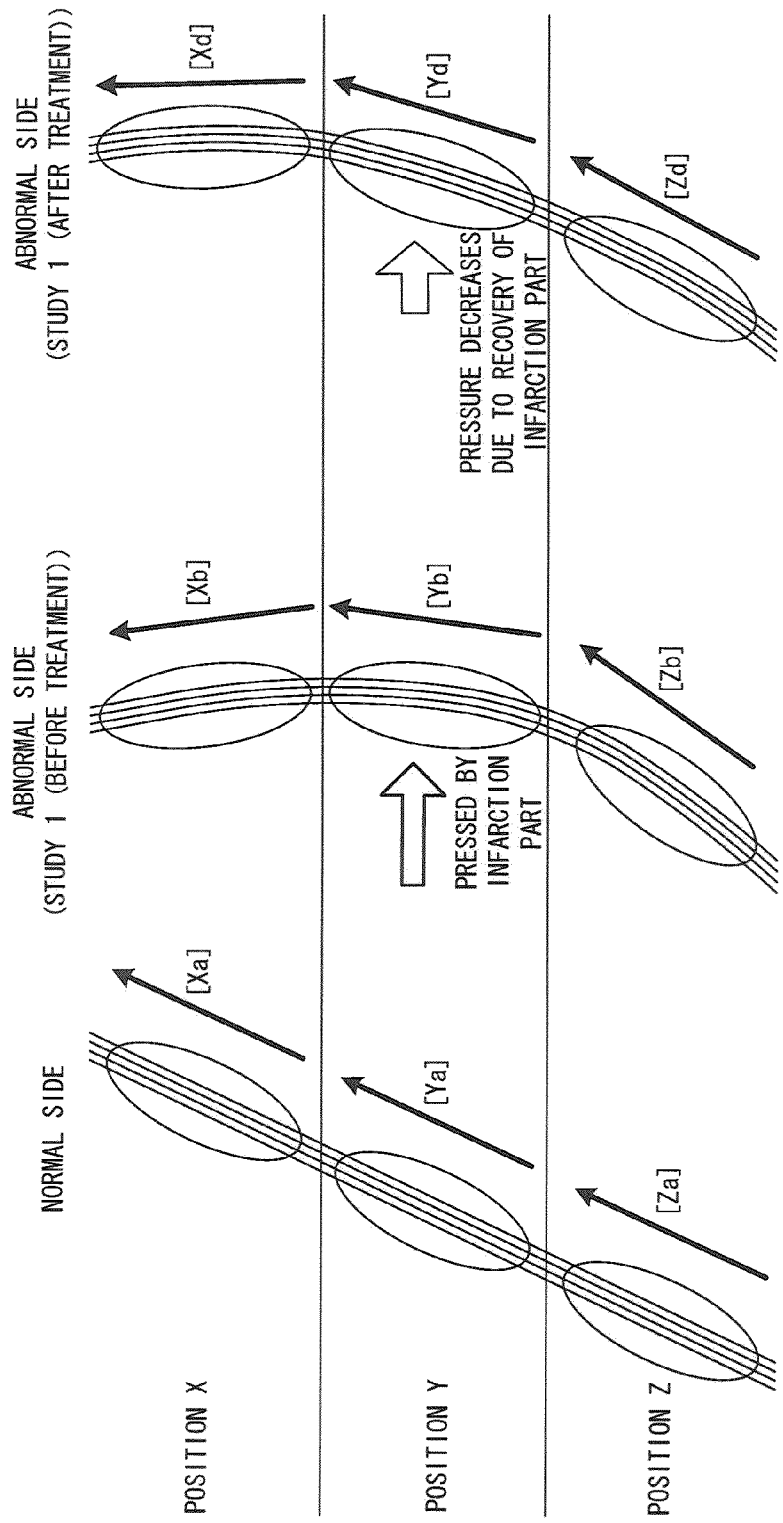
FIGS. 9A-C provide a first diagram which illustrates how to calculate a recovery degree.

Then, an operation to compare the abnormal side in the study 1 before being treated with the abnormal side in the study 2 or 3 after being treated so as to calculate the recovery degree B will be explained with reference to FIG. 8. Incidentally, suppose that there is no difference on the normal side between the study 1 and the study 2.

The line shape information generating unit 106 makes DTT images of the normal side and the abnormal side in the study 2, and calculate a diffusion direction vector (step S301). The diffusion direction vector at this time is called an abnormal side vector in the study 2. Meanwhile, the image obtaining unit 101 obtains a diffusion direction vector on the abnormal side calculated from the DTT image in the study 1 before the treatment (called an abnormal side vector in the study 1) from the image database 21 (step S303).

The comparing unit 107 compares the abnormal side vector in the study 2 calculated at the step S301 with the abnormal side vector in the study 1 obtained by the image obtaining unit 101 at the step S303, so as to calculate a recovery degree in an interval between the studies 1 and 2 (step S305).

FIGS. 9A-C and FIG. 10 illustrate an example of a method for specifically calculating a recovery degree. FIG. 9 (A) is a conceptual diagram of nerve fibers on particular positions X, Y and Z on the normal side, in the way similar to FIG. 7A, and illustrates examples of diffusion direction vectors calculated from the nerve fibers at the respective positions, i.e., normal side vectors [Xa], [Ya] and [Za] FIG. 9 (B) is a conceptual diagram of the nerve fibers at positions anatomically corresponding to the positions in FIG. 9 (A) on the abnormal side before a treatment, and illustrates examples of diffusion direction vectors calculated from the nerve fibers at the respective positions, i.e., abnormal side vectors [Xb], [Yb] and [Zb]. The nerve fibers on the abnormal side are locally deformed with respect to the normal side as being pressed by the infarction part, etc. similarly as in FIG. 7 (B). FIG. 9 (C) illustrates abnormal side vectors [Xd], [Yd] and [Zd] calculated from the nerve fibers on the abnormal side, in the way similar to FIG. 9B. While FIG. 9 (B) illustrates the abnormal side vectors calculated from data in the study 1 before the treatment, though, FIG. 9 (C) illustrates the abnormal side vectors calculated from data in the study 2 (or study 3) after the treatment. These drawings illustrate that the infarction part is reduced owing to the treatment and the pressure from the infarction part decreases, and that the local deformation of the nerve fibers resultantly is coming close to normal condition.

Figure 10:
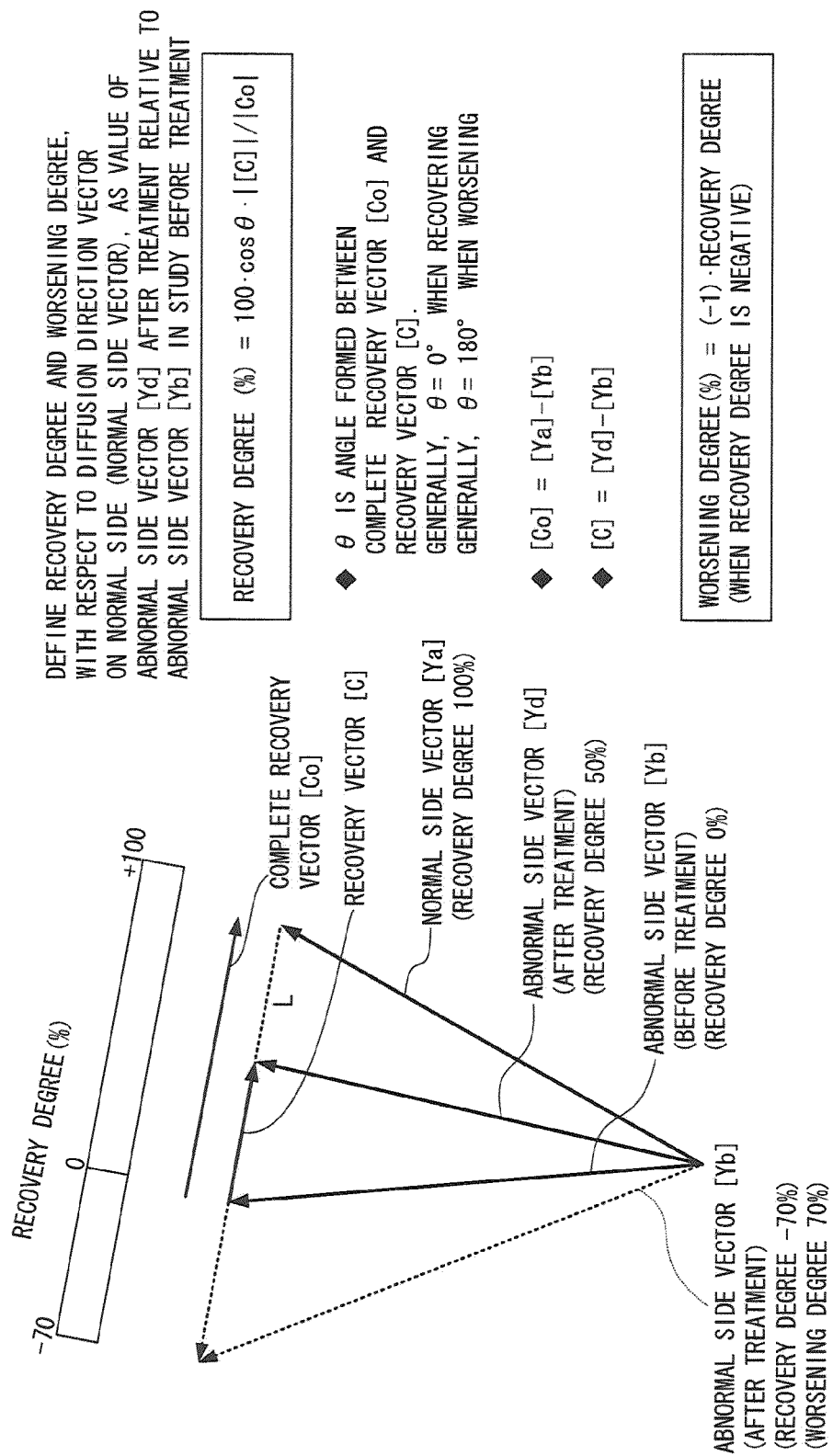
FIG. 10 is a second diagram which illustrates how to calculate a recovery degree.

FIG. 10 illustrates a method for calculating the recovery degree by using the normal side vector [Ya], the abnormal side vector [Yb] in the study 1 and the abnormal side vector [Yc] in the study 2 at the position Y as examples. According to the embodiment, the recovery degree is defined as a relative value (ratio), with respect to the diffusion direction vector on the normal side (i.e., normal side vector), as follows. The ratio of "a difference of the abnormal side vectors between before and after the treatment" to "a difference between the abnormal and normal side vectors before the treatment" is defined as the relative value. Specifically, the recovery degree is an index defined (in percent) according to a following equation.

$$\text{Recovery degree(in percent)} = 100 * \cos\theta * |[C]|/|[C_0]|$$

In the above equation, the term $|[C_0]|$ is an absolute value of a vector going from the vertex of the abnormal side vector [Yb] before the treatment to the vertex of the normal side vector [Ya] (called a complete recovery vector $[C_0]$) according to a following equation.

$$[C_0] = [Ya] - [Yb]$$

Further, the term $|[C]|$ is an absolute value of a vector going from the vertex of the abnormal side vector [Yb] before treatment (study 1) to the vertex of the abnormal side vector [Yd] after the treatment (the study 2 or the study 3) (called a recovery vector [C]).

Further, the term $\theta$ is an angle formed between the complete recovery vector $[C_0]$ and the recovery vector [C], and is usually given a value $\theta = 0°$ on a way of recovery (when the abnormal side vector comes close to the normal side vector) and a value $\theta = 180°$ on a way of turning worse (when the abnormal side vector goes away from the normal side vector). Incidentally, a recovery degree having a negative value may be multiplied by (−1) to be made positive and defined as a worsening degree.

Incidentally, the recovery degree is 0 percent with respect to the abnormal side vector before the treatment according to the equation which defines the recovery degree. The recovery degree grows in the positive direction as the abnormal side vector after the treatment comes close to the normal side vector, and is 100 percent when the abnormal side vector exactly agrees with the normal side vector. Further, the recovery degree grows in the negative direction as the abnormal side vector after the treatment goes away from the normal side vector, and the worsening degree grows in the positive direction.

The recovery (or worsening) degree may be calculated from the diffusion direction vector (the normal side vector or the abnormal side vector) in every voxel on a voxel basis, and may be calculated on an over-voxel basis upon a plurality of diffusion direction vectors being linked. The recovery (or worsening) degree calculated in this way at each of the positions is stored in the image database 21 together with the DTT image in the study 2 (or the study 3).

FIG. 10 illustrates an exemplary case in which the vertex of the abnormal side vector after the treatment (in the study 2) comes onto a straight line L connecting the vertex of the normal side vector and the vertex of the abnormal side vector before the treatment (in the study 1). Depending upon a magnitude (absolute value) of the abnormal side vector [Yd] after the treatment (in the study 2), though, the vertex of the abnormal side vector [Yd] may stay off the straight line L in some cases. If that is the case, the absolute value of the abnormal side vector [Yd] may be suitably changed while maintaining the direction of the abnormal side vector [Yd], in such a manner that the terminal point of the abnormal side vector [Yd] comes onto the straight line L.

Figure 11:
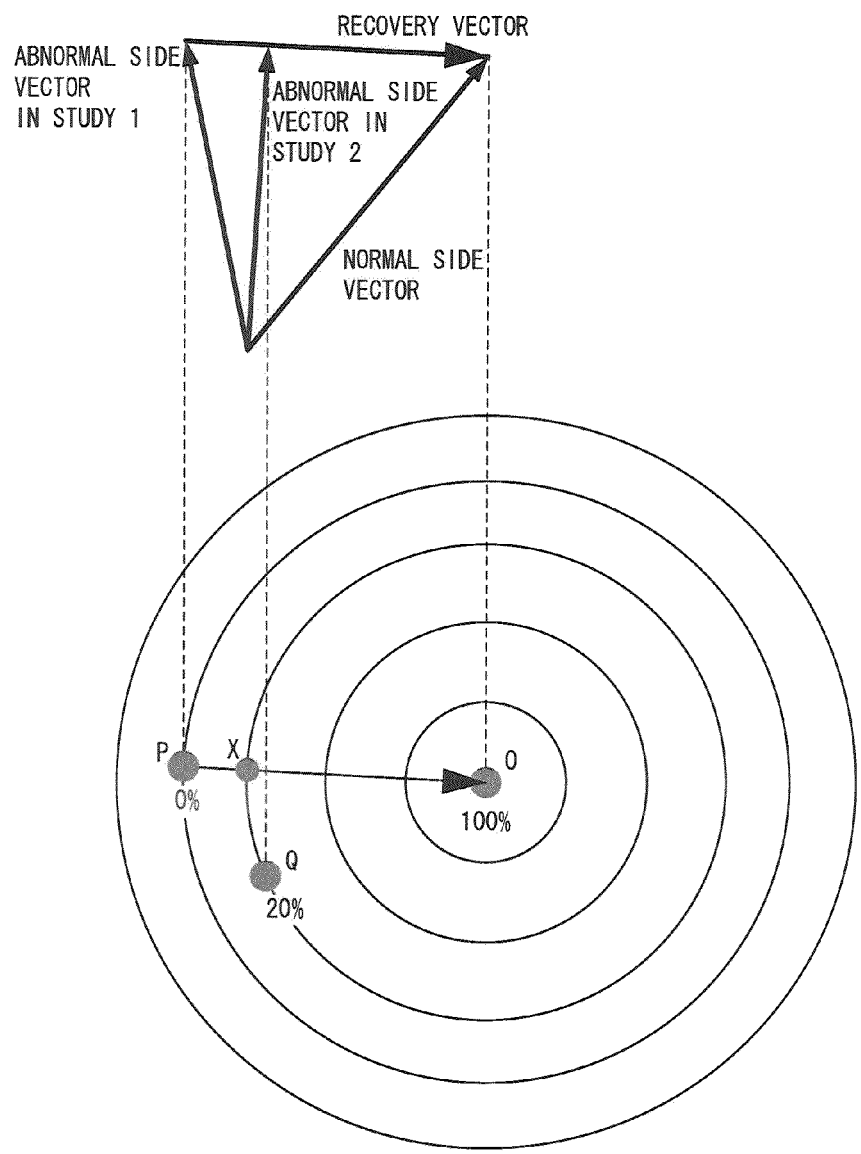
FIG. 11 illustrates how to calculate a recovery degree of nerve fibers three-dimensionally.

Further, as a diffusion direction vector is three-dimensional, the abnormal side vector in the study 2 is not always on a plane in which the abnormal side vector in the study 1 and the normal side vector are included. If that is the case, the terminal points of the respective three-dimensional vectors are projected onto a two-dimensional plane so as to calculate the recovery degree from concentric circles centered at the terminal point of the projected normal side vector as illustrated in FIG. 11. Specifically, the terminal point of the projected normal side vector is defined as "O", the terminal point of the projected abnormal side vector in the study 1 is defined as "P", and the terminal point of the projected abnormal side vector in the study 2 "Q". Then, a vector PO is a recovery vector of a recovery degree of 100 percent. By drawing a circle centered at the point O passing the point Q, an intersection point X between this circle and the vector PO is calculated. A recovery degree is calculated according to a ratio in magnitude of the vector PX to the vector PO. As the ratio in magnitude of the vector PX to the vector PO is 20 percent, e.g., a recovery degree of 20 percent is calculated in the case of FIG. 11.

Figure 12:
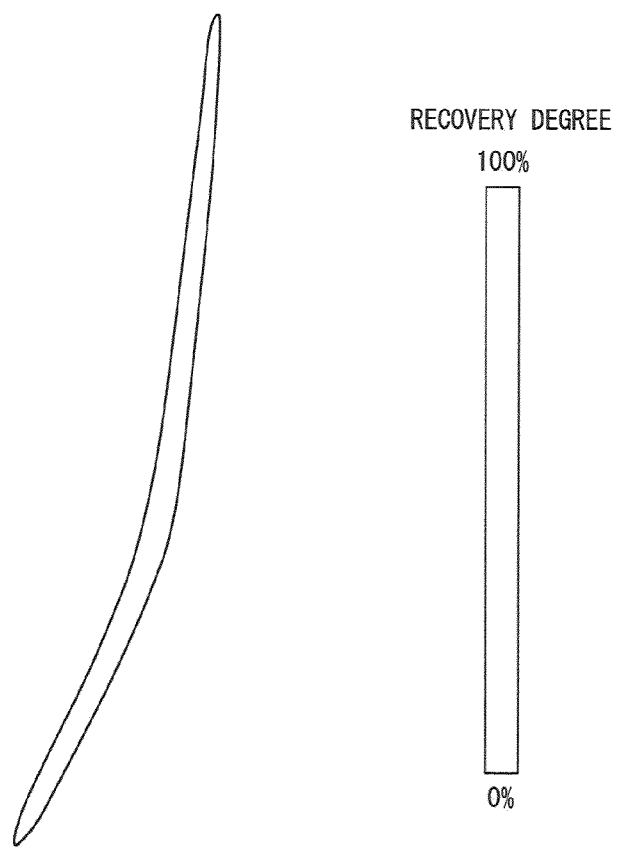
FIG. 12 illustrates an example of an indication of a recovery degree of nerve fibers.

If a DTT image of nerve fibers taken in the study 2 is displayed, the recovery degree calculated as described above may be indicated separately by color according to the level of the recovery degree. FIG. 12 illustrates a displayed example. In FIG. 12, the color of the nerve fibers grows dark as the recovery degree grows high. Further, as to the display of the recovery degree, only nerve fibers of recovery degrees lower than a particular value may be indicated on the DTT image. Further, a threshold value which determines the recovery degree to be indicated may be made selectable. An efficient analysis can thereby be enabled such that only parts not having recovered enough or even worsening are extracted from an image of nerve fibers having a complicated shape and high density of information.

Further, in order to indicate the abnormality degree described above, the nerve fibers may be indicated separately by color according to the level of the abnormality degree on the DTT images in the respective studies, in the way similar to the case of FIG. 12. In this case, extract and indicate only parts of a high abnormality degree from an image of nerve fibers having complicated shapes and high density of information so as to visually and easily check where and to what extent abnormal parts are, as well.

<Calculate the Difference C on the Normal Side>

The operation to compare "the normal side in the study 1 before the treatment" with "the normal side in the study 2 after the treatment" so as to calculate "the difference on the normal side" is the same as the comparison on the abnormal side in the operation to calculate the recovery degree, and its explanation is omitted. Incidentally, the difference on the normal side is calculated after calculating the worsening degree and before calculating the recovery degree in each of the studies. Then, the result of calculating the difference on the normal side is included into the calculation of the recovery degree. Exact values of the recovery degree can thereby be obtained on the abnormal side, even if there is any change, e.g. with time on the normal side between pre- and post-treatment conditions.

<In Case of Damaged Nerve Fibers>

Figure 5:
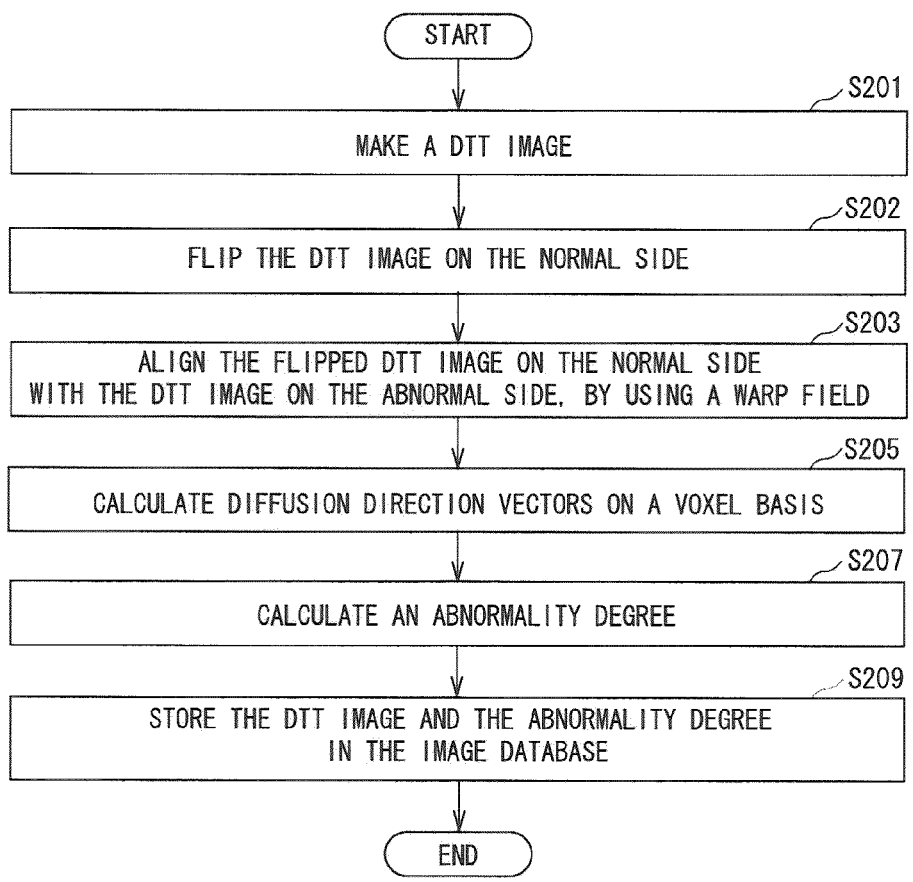
FIG. 5 is a flowchart which illustrates an operation to make a DTT image of nerve fibers and calculate an abnormality degree.
Figure 13:
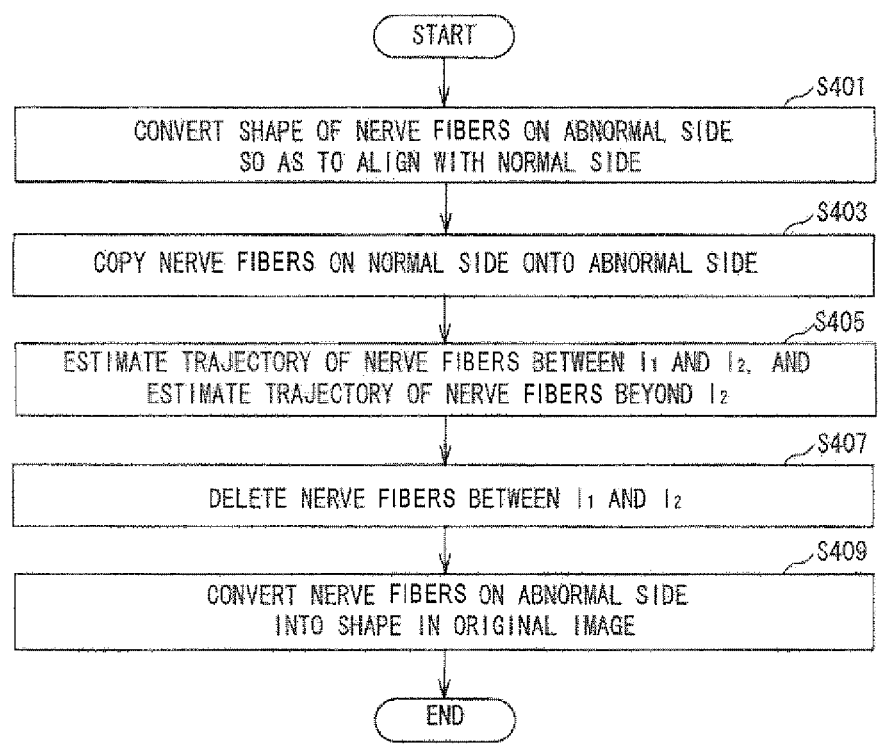
FIG. 13 is a flowchart which illustrates an operation to estimate nerve fibers in a case where the nerve is damaged on a diseased side.

When a DTT image of the nerve fibers is made from the DTI image at the step S201 illustrated in FIG. 5, the nerve may have been affected by the abnormal part and thus damaged resulting in that the maximum diffusion direction can be hardly tracked on the DTI image and that the DTT image can be made only halfway in some cases. An operation to estimate the nerve fibers in such a case will be explained with reference to a conceptual diagram in FIG. 14 and a flowchart in FIG. 13.

Suppose that the nerve is damaged and cut off between positions $l_1$ and $l_2$ on the abnormal side as illustrated in FIG. 14 (A). FIG. 14 (B) illustrates DTT images of the normal side and the abnormal side in this case. The DTT image is made in condition that the diffusion direction of the nerve fibers is not known beyond the position $l_1$ as the nerve is damaged at the position $l_1$ on the abnormal side. Thus, though the nerve is present beyond the position $l_2$, the maximum diffusion direction cannot be tracked. Thus, the shape conversion unit 108 uses the warp field calculated at the step S109 and converts the DTT image on the abnormal side in such a manner that an anatomical position of the nerve fibers up to the damaged portion agrees with an anatomical position of the nerve fibers on the normal side (step S401).

Then, the shape conversion unit 108 flips the nerve fibers on the normal side and copies the flipped nerve fibers onto the abnormal side (step S403). The nerve fibers copied from the normal side onto the abnormal side is indicated by dotted lines in FIG. 14 (C).

The nerve is damaged only between the positions $l_1$ and $l_2$, and is extended from the position $l_2$ again, as shown in FIG. 14 (A). Thus, if a trajectory between the positions $l_1$ and $l_2$ is known on the DTT image on the abnormal side in FIG. 14C, the tracking operation can be continually performed, as the diffusion direction is known beyond the position $l_2$. As the nerve fibers on the normal side are copied at the step S403, the estimation unit 105 can estimate the trajectory between the positions $l_1$ and $l_2$ where the nerve is damaged on the abnormal side and can estimate a trajectory beyond the position $l_2$ (step S405). The position $l_2$ on the DTT image is set as an ROI (Region Of Interest) for restarting tracking.

Then, the line shape information generating unit 106 deletes the nerve fibers between the positions $l_1$ and $l_2$ having been copied from the normal side at the step S403 (step S407), so as to return to the damaged condition.

Because the nerve fibers on the abnormal side found at the step S407 have been deformed, these nerve fibers do not have an intrinsic shape on the abnormal side. Thus, the shape conversion unit 108 converts "the shape of the nerve fibers on the abnormal side having been deleted at the step S407" into "the original shape" on the basis of the warp field (step S409).

As a result, even if the nerve is damaged in the middle, the nerve fibers can be estimated from the normal side by the use of the warp field. The nerve fibers beyond the damaged portion which used to be incapable of being tracked can thereby be tracked so as to make a DTT image.

<Other Examples>

Figure 15:
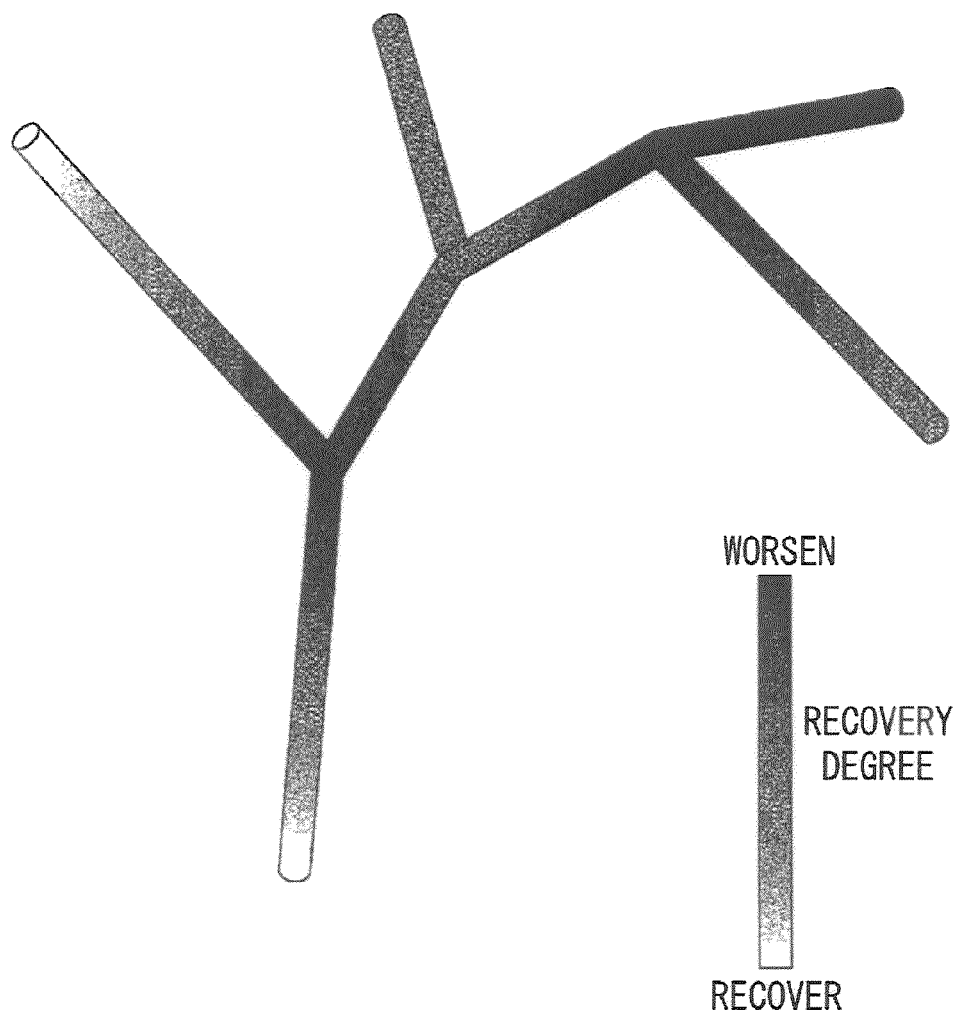
FIG. 15 illustrates an example of an indication of a recovery degree of a blood vessel system.
Figure 16:
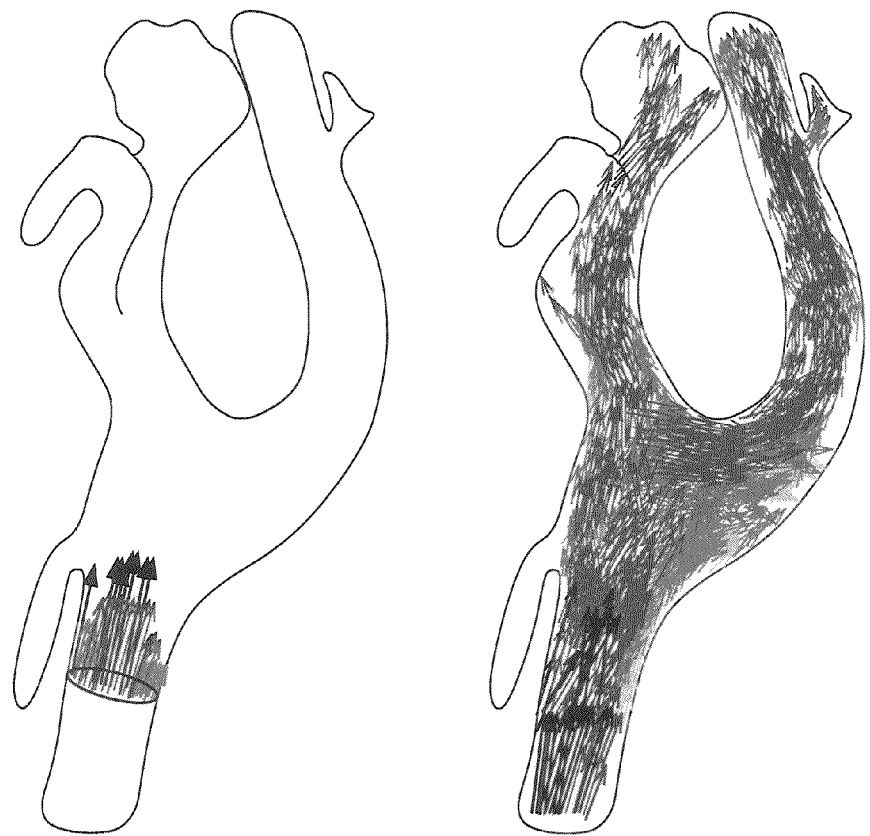
FIG. 16 illustrates an example of an indication of a recovery degree of a blood flow.

Incidentally, the recovery degree is calculated and displayed with regard to the nerve fibers according to the embodiment described above. The recovery degree can be similarly calculated and displayed separately by color with regard to other line shape information except for the nerve fibers, such as a blood vessel system or blood flows. FIG. 15 and FIG. 16 illustrate examples of recovery degrees in a cerebral blood system and in a blood flow, respectively. As the blood vessel system has lots of diverging points differently from the nerve fibers, the recovery degree can be calculated and indicated for every extracted blood vessel into which the blood vessel system is divided at the diverging points. Further, a blood vessel or a diverging point of an object to be observed, e.g. around a cerebral infarction part can be specified, as well. Further, if a blood vessel, e.g. coronary artery chronologically changes its shape, a chronological recovery degree and a side effect on another part can be indicated as the shape of the coronary artery is tracked for every phase of an R-R period in an ECG (Electrocardiogram).

A recovery degree for a blood flow is calculated by obtaining a blood flow vector by means of an analytical process. As to a part such as a part around the heart in which blood flow significantly changes its velocity, a chronological blood flow vector for every phase of an R-R period in an ECG (Electrocardiogram) is calculated so that an instantaneous abnormal blood flow can be expressed.

According to the embodiment described above, as to line shape information having high information density such as nerve fibers, a blood vessel system or a blood flow, a worsening degree is calculated after absorbing a shape difference between a normal side and an abnormal side, by taking a difference between an abnormal side vector before a treatment and a normal side vector calculated from a DTT image. A worsening degree in a study before the treatment is defined as a recovery vector of a 100 percent recovery degree. Then, a ratio of the recovery degree is calculated on the basis of a position where an abnormal side vector after the treatment is tangential onto a line segment of the recovery vector, and the calculated ratio is displayed according to the recovery degree. An efficient analysis can thereby be enabled such that only parts not having recovered enough or even worsening are extracted from an image of nerve fibers having a complicated shape and high density of information and that a treatment effect is checked, etc.

Although the embodiment of the present invention have been described above in detail with reference to the drawings, the embodiment can be modified, within the scope of the invention, in designing a specific constitution without being limited to what is described above.

What is claimed is:

1. An image diagnosis apparatus comprising:
a line shape information generating unit configured to generate first diffusion direction information of a first nerve fiber corresponding to a first medical image and second diffusion direction information of a second nerve fiber corresponding to a second medical image, respectively; and
a comparing unit configured to compare the first diffusion direction information with the second diffusion direction information.

2. An image diagnosis apparatus comprising:
a line shape information generating unit configured to generate first line shape information corresponding to a first medical image and second line shape information corresponding to a second medical image, respectively;
a comparing unit configured to compare the first line shape information with the second line shape information;
an image obtaining unit configured to obtain a medical image;
a region dividing unit configured to divide the medical image obtained by the image obtaining unit into a first region including an abnormal part and a second region excluding the abnormal part; and
a displacement calculating unit configured to calculate a shape displacement in the first region and the second region into which the region dividing unit divided the medical image;
wherein the line shape information generating unit is configured to generate the first line shape information and the second line shape information by using the first medical image corresponding to the first region and the second medical image corresponding to the second region, respectively; and
the comparing unit is configured to compare the first line shape information with the second line shape information after aligning the first line shape information with the second line shape information by using the shape displacement calculated by the displacement calculating unit.

3. The image diagnosis apparatus according to claim 2, wherein:
the first medical image and the second medical image are obtained at a same time.

4. An image diagnosis apparatus comprising:
a line shape information generating unit configured to generate first line shape information corresponding to a first medical image and second line shape information corresponding to a second medical image, respectively; and
a comparing unit configured to compare the first line shape information with the second line shape information,
wherein the comparing unit is configured to compare the first line shape information in a predetermined region corresponding to the first medical image obtained at a first time with the second line shape information in a same region corresponding to the second medical image obtained at a second time, so as to calculate a recovery degree after a treatment from pre-treatment condition.

5. The image diagnosis apparatus according to claim 2, wherein:
the comparing unit is configured to compare the first line shape information with the second line shape information so as to calculate an abnormality degree.

6. The image diagnosis apparatus according to claim 5, wherein:
the abnormality degree calculated by the comparing unit is a magnitude of a vector which indicates a difference between a vertex position of a direction vector in the first region based on the line shape information and a vertex position of a direction vector in the second region based on the line shape information.

7. The image diagnosis apparatus according to claim 4, wherein:
the comparing unit is configured to calculate the recovery degree by using a difference between a direction vector based on line shape information in a predetermined region in a study after treatment and a direction vector based on line shape information in the predetermined region in a study before the treatment.

8. The image diagnosis apparatus according to claim 4, further comprising:
a display unit configured to indicate a level of the recovery degree calculated by the comparing unit.

9. The image diagnosis apparatus according to claim 5, further comprising:
a display unit configured to indicate a level of the abnormality degree calculated by the comparing unit.

10. The image diagnosis apparatus according to claim 2, wherein:
the displacement calculating unit is configured to calculate the shape displacement as a warp field expressed as a collective vector field of which a vector indicates a positional difference between a point in the first region and a point in the second region anatomically identical to each other.

11. The image diagnosis apparatus according to claim 2, wherein:

the first line shape information and the second line shape information include at least one of nerve fibers, a blood vessel and blood flow velocity.

12. The image diagnosis apparatus according to claim 2, further comprising:
an estimation unit configured to substitute line shape information in the second region corresponding to a damaged region for the damaged region so as to estimate line shape information in the first region beyond the damaged region, when the line shape information in the first region is so damaged as to be incapable of obtaining line shape information beyond the damaged region.

13. The image diagnosis apparatus according to claim 1, further comprising:
an image obtaining unit configured to obtain a medical image;
a region dividing unit configured to divide the medical image obtained by the image obtaining unit into a first region including an abnormal part and a second region excluding the abnormal part; and
a displacement calculating unit configured to calculate a shape displacement in the first region and the second region into which the region dividing unit divided the medical image;
wherein the line shape information generating unit is configured to generate the first diffusion direction information and the second diffusion direction information by using the first medical image corresponding to the first region and the second medical image corresponding to the second region, respectively; and
the comparing unit is configured to compare the first diffusion direction information with the second diffusion direction information after aligning the first diffusion direction information with the second diffusion direction information by using the shape displacement calculated by the displacement calculating unit.

14. The image diagnosis apparatus according to claim 1, wherein:
the first medical image and the second medical image are obtained at a same time.

15. The image diagnosis apparatus according to claim 1, wherein:
the comparing unit is configured to compare the first diffusion direction information in a predetermined region corresponding to the first medical image obtained at a first time with the second diffusion direction information in a same region corresponding to the second medical image obtained at a second time, so as to calculate a recovery degree after a treatment from pre-treatment condition.

16. The image diagnosis apparatus according to claim 13, wherein:
the comparing unit is configured to compare the first diffusion direction information with the second diffusion direction information so as to calculate an abnormality degree.

17. The image diagnosis apparatus according to claim 16, wherein:
the abnormality degree calculated by the comparing unit is a magnitude of a vector which indicates a difference between a vertex position of a direction vector in the first region based on the line shape information and a vertex position of a direction vector in the second region based on the line shape information.

18. The image diagnosis apparatus according to claim 15, wherein:
the comparing unit is configured to calculate the recovery degree by using a difference between a direction vector based on line shape information in a predetermined region in a study after treatment and a direction vector based on line shape information in the predetermined region in a study before the treatment.

19. The image diagnosis apparatus according to claim 15, further comprising:
a display unit configured to indicate a level of the recovery degree calculated by the comparing unit.

20. The image diagnosis apparatus according to claim 16, further comprising:
a display unit configured to indicate a level of the abnormality degree calculated by the comparing unit.

21. The image diagnosis apparatus according to claim 13, wherein:
the displacement calculating unit is configured to calculate the shape displacement as a warp field expressed as a collective vector field of which a vector indicates a positional difference between a point in the first region and a point in the second region anatomically identical to each other.

22. The image diagnosis apparatus according to claim 13, further comprising:
an estimation unit configured to substitute line shape information in the second region corresponding to a damaged region for the damaged region so as to estimate line shape information in the first region beyond the damaged region, when the line shape information in the first region is so damaged as to be incapable of obtaining line shape information beyond the damaged region.

* * * * *